United States Patent [19]
Norton

[11] Patent Number: 4,746,821
[45] Date of Patent: May 24, 1988

[54] CONSTANT PHASE LIMITING INDEPENDENT OF INPUT SIGNAL AMPLITUDE

[75] Inventor: David E. Norton, Burlington, Mass.

[73] Assignee: Adams-Russell Co. Inc., Waltham, Mass.

[21] Appl. No.: 829,626

[22] Filed: Feb. 14, 1986

[51] Int. Cl.[4] .................. H03K 5/08; H03K 3/26; H03K 17/74

[52] U.S. Cl. .................. 307/565; 307/262; 307/317 R; 307/257; 328/155

[58] Field of Search ............ 307/262, 317 R, 511, 307/540, 257, 565, 559; 328/162, 155

[56] References Cited

U.S. PATENT DOCUMENTS

| | | | |
|---|---|---|---|
| 3,008,076 | 11/1961 | MacDonald | 307/317 |
| 3,254,304 | 5/1966 | Barret | 307/491 |
| 3,351,863 | 11/1967 | Riemens | 307/317 R |
| 4,418,319 | 11/1983 | Mahoney et al. | 307/317 R |

OTHER PUBLICATIONS

Ananasso, "Low Phase Shift Step Attenuator Using P-i-N Diodes Switches," IEEE MTT, vol. MTT-28, No. 7, Jul. 80, pp. 774-776.

Primary Examiner—Stanley D. Miller
Assistant Examiner—Timothy P. Callahan
Attorney, Agent, or Firm—Charles Hieken

[57] ABSTRACT

A constant phase diode limiter has a pair of oppositely poled diodes in series between the primary of an output transformer and an input terminal. The junction of the diodes is connected to a voltage source through a resistor and inductor. A capacitor having the same value as the capacitance of each of the diodes when nonconducting is connected between the input and the secondary winding of the output transformer. The secondary winding of the output transformer is connected in series between the output terminal and the latter capacitor.

4 Claims, 4 Drawing Sheets

CONSTANT PHASE LIMITING INDEPENDENT OF INPUT SIGNAL AMPLITUDE

The present invention relates in general to limiting and more particularly concerns novel apparatus and techniques for providing limiting over a relatively wide dynamic range with phase shift imparted by the limiter substantially independent of input signal level.

Prior art limiter circuits typically comprise a current source driving diode pairs or quads to provide an output signal of nearly constant voltage for a large range of input signal levels. However, these circuits typically introduce transmission phase shift which varies as a function of the input signal level. This property is especially disadvantageous where the input signal applied to the limiter carries phase-modulated information. A phase-sensitive detector following the limiter ordinarily cannot distinguish between phase shift representative of the desired information and phase shift introduced by the limiter as a function of input signal level. The detected output signal therefore does not accurately represent the phase-modulated information on the input signal.

Accordingly, it is an important object of this invention to provide improved methods and means for limiting an input signal over a wide dynamic range while introducing negligible variation in phase shift caused by the limiter as a function of input signal level.

It has been discovered that the source of the problem is the capacitance of the nonconducting diode or diodes in the limiter.

According to the invention there is neutralizing circuit means for neutralizing the effective capacitance of the off diode or diodes. According to a preferred aspect of this invention, the neutralizing circuit means comprises transformer means and neutralizing capacitor means for effectively canceling the undesired current flowing through the effective capacitance of the off diode or diodes. According to another aspect of the invention, the off capacitance may be resonated with inductive means at a desired frequency.

Numerous other features, objects and advantages of the invention will become apparent from the following specification when read in connection with the accompanying drawing in which.

Figure 1:
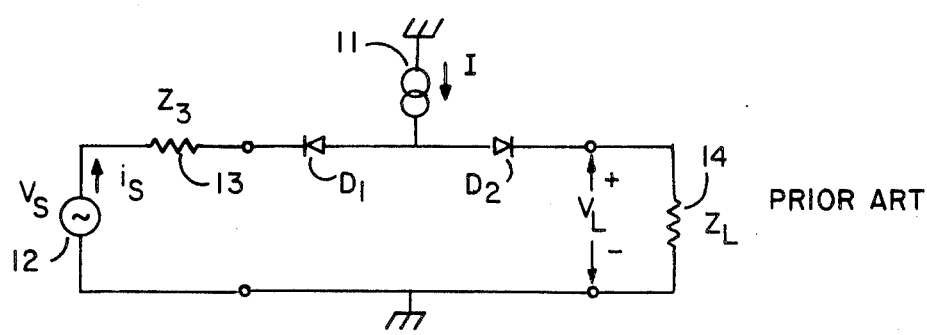
FIG. 1 is a schematic circuit diagram of a conventional limiter.

With reference now to the drawing and more particularly FIG. 1, there is shown a schematic circuit diagram of a conventional dual diode limiter circuit comprising oppositely poled diodes D1 and D2 driven at their junction by current source 11. Voltage source 12 having a source impedance 13 of value $Z_S$ drives the limiter to develop a limited output voltage $V_L$ across load impedance 14 of value $Z_L$.

Operation is as follows:

With signal source 12 off and with source impedance $Z_S$ = load impedance $Z_L$, the current I from current source 11 divides equally between diodes D1 and D2 to bias them on by current I/2 and cause the diode impedances to be a small resistance dependent upon the magnitude of the current I. When signal source 12 is on at small amplitude, there is transmission through the conducting diodes to the load impedance 14 with some attenuation depending on the resistance of the conducting diodes. With the signal current $I_s$ small with respect to the biasing current I/2, the circuit operation is essentially linear. The output signal level $V_L$ varies directly with the input level $E_s$ with the small attenuation introduced by the conducting resistance of diodes D1 and D2.

When the input signal level $V_s$ is increased, the magnitude of the RF voltage across diodes D1 and D2 exceeds the quiescent voltage established by the biasing currents, and diodes D1 and D2 become reverse-biased, one at a time, on alternate half-cycles of the RF signal $V_s$. When one diode becomes reverse-biased, the current flow through it stops. Since the current from constant current source 11 must remain constant, it must flow through the forward-biased diode and then through the load. No matter how large the input signal $V_s$, the output current through load 14 can only increase by the amount I/2 beyond the quiescent current, with the result that the output is limited to a level which is completely determined by the current I set by the current source 11, rather than the input signal level $V_s$.

Figure 2A:
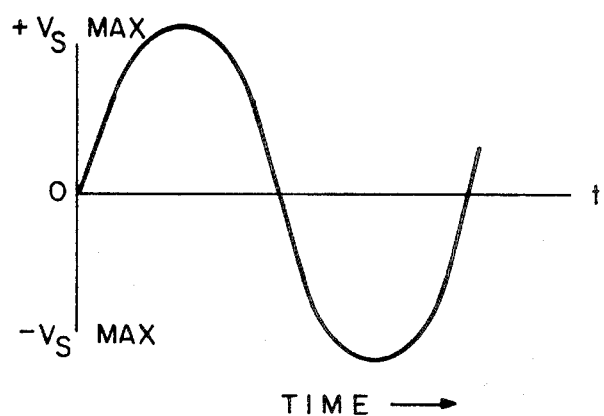
FIGS. 2A and 2B are graphical representations of a typical input signal and limited output signal of the limiter of FIG. 1 plotted to a common time scale.
Figure 2B:
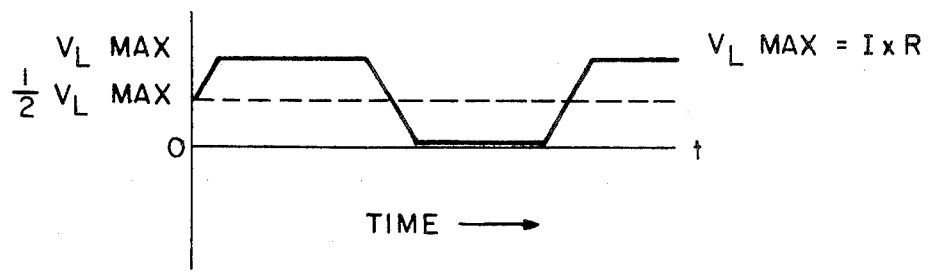

Referring to FIGS. 2A and 2B, there are shown graphical representations of the input signal $V_s$ and the output voltage $V_L$ plotted to a common time scale to illustrate this mode of operation. Note that the quiescent current through load 14 is I/2, the peak current is I for positive input voltage peaks, and the current drops to zero during the negative input voltage peaks.

Figure 3:
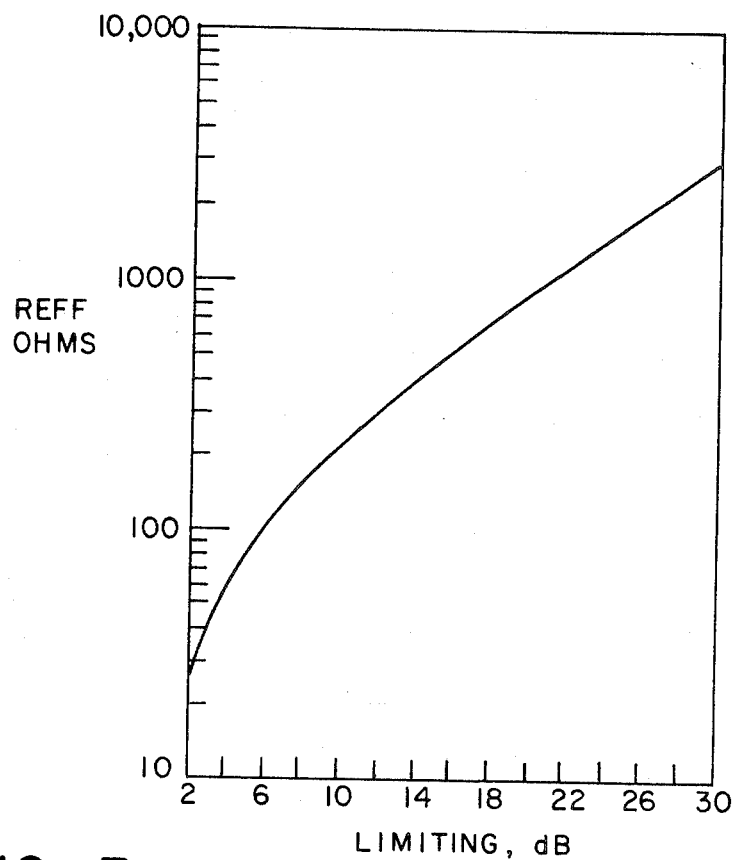
FIG. 3 is a graphical representation of effective limiter resistance as a function of limiting.

The limiter circuit of FIG. 1 functions as a nonlinear resistor in series between source 12 and load 14 of value that increases with increasing input level $V_s$ at just the right rate to maintain a constant output level. Referring to FIG. 3, there is shown a graphical representation of effective limiter resistance as a function of limiting in decibels. The explanation set forth above is helpful in understanding the phase shift introduced by the limiter during transmission.

If the actual circuit conformed to the purely resistive model described above, there would be no phase shift between input and output at all limiting levels. However, the physical circuit is not purely resistive because of the diode capacitance. This capacitance exists across the diode junction and may be schematically represented as in parallel with the effective limiter resistance. This capacitance allows a shunting current to flow from source 12 to load 14 with a leading phase angle. This current is negligible for small signals where the series resistance is low, particularly for low capacitance diodes. As the input signal increases, however, the series resistance increases as indicated in FIG. 3, and the capacitive current component is no longer negligible.

Figure 4:
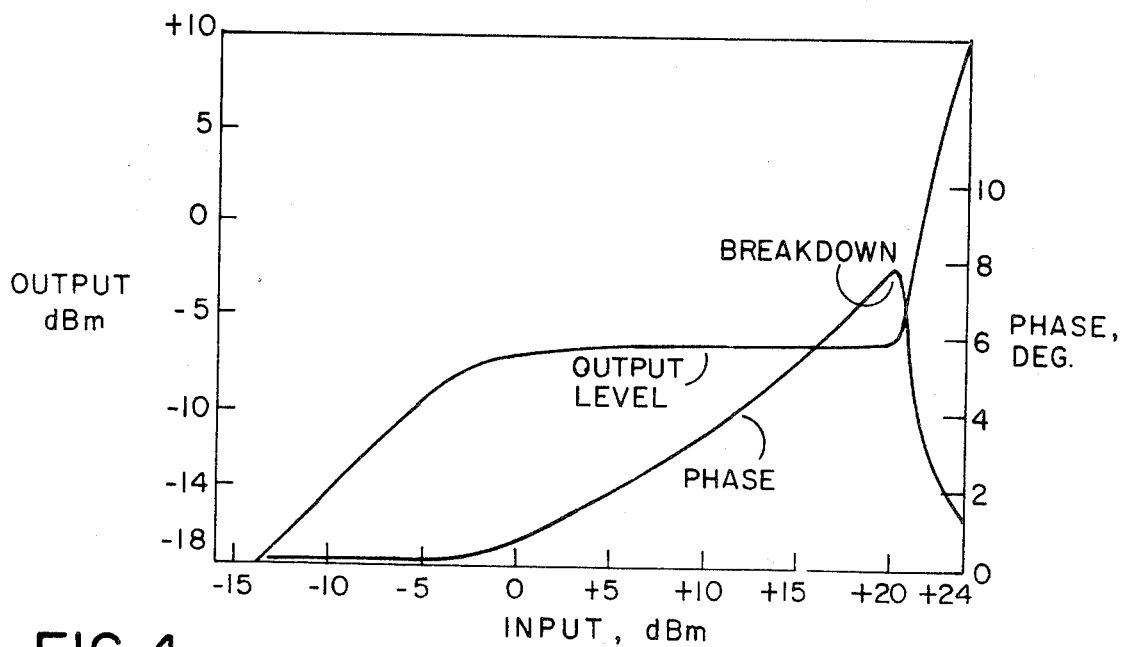
FIG. 4 is a graphical representation of both output level and phase shift as a function of input signal level.

Referring to FIG. 4, there is shown a calculated graphical representation of both output level and transmission phase shift as a function of input signal amplitude $V_s$. Note that there is increasing phase shift with increasing signal level over essentially the entire region of limiting.

Figure 5:
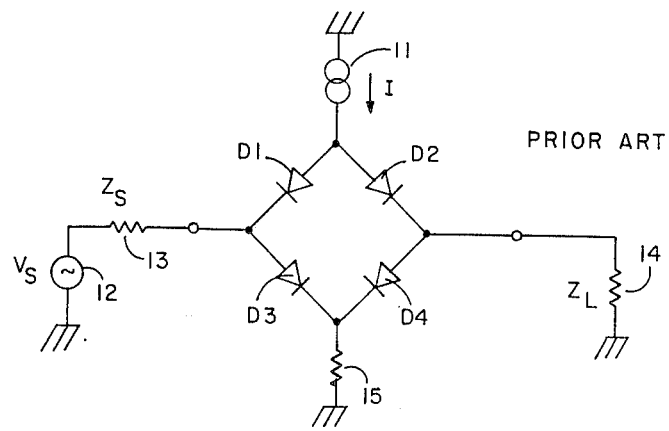
FIG. 5 is a schematic circuit diagram of a prior art diode quad limiter.

Referring to FIG. 5, there is shown a diode quad version of the limiter of FIG. 1 in which diodes D3 and D4 and resistor 15 have been added. Operation of the circuit of FIG. 5 is the same as the circuit of FIG. 1 except that the limiting level is 6 dB higher for the same constant current level I. In this case the quiescent current level in load impedance 14 is zero (blocking capacitors have been omitted in FIG. 5) while the peak current swings between I and $-I$, thus explaining the output level difference. This circuit suffers from twice the phase shift as the circuit of FIG. 1, however, because the capacitance of two "off" diodes is in parallel with the limiting resistance.

Figure 6:
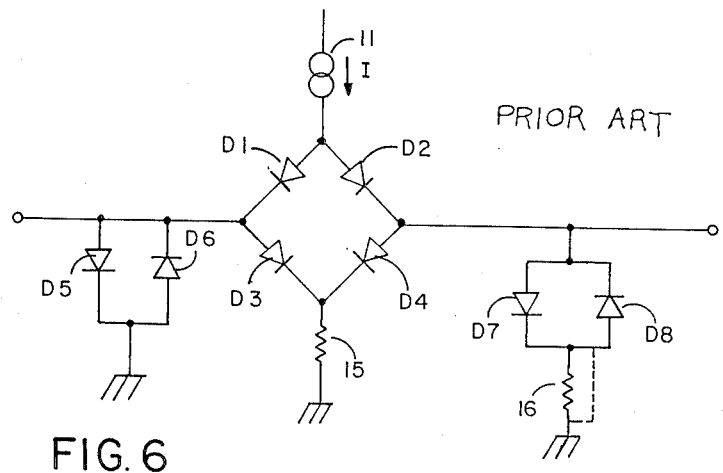
FIG. 6 is a schematic circuit diagram of a variation of the circuit of FIG. 5 using shunt diodes at the input and output.

Referring to FIG. 6, there is shown a modification of the circuit of FIG. 5 using oppositely poled shunt diodes D5 and D6 at the input and D7 and D8 at the output. Without the shunt diodes, this limiter circuit presents a high imput impedance to large signals, and high reverse voltage exists across the reverse-biased diodes, making reverse voltage breakdown a problem. With the input shunt diode pair present, the large signal input impedance is low instead of high, and the reverse breakdown problem is avoided. The output diode pair D7 and D8, with or without resistor 16, may be used to improve the output impedance match in limiting.

Figure 7:
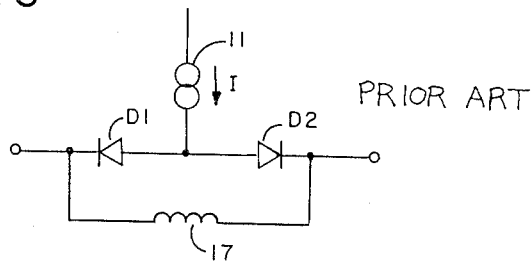
FIG. 7 is a schematic circuit diagram using an inductor across the limiting diodes.

Referring to FIG. 7, there is shown one approach for overcoming the phase shift effect introduced by the capacitance of the nonconducting diode. Inductor 17 is connected across the series combination of diodes D1 and D2 and is of a value to resonate with the capacitance of the nonconducting diode at the center frequency of the input signal $V_s$. Although this embodiment will work, it operates over a relatively narrow band of frequencies because the diode capacitance can be resonated only at a single frequency. Since the diode capacitance is very low, typically 0.3 pf for microwave Schottky diodes, the circuit Q is high, and the resulting constant phase limiting bandwidth is relatively limited. It may also be difficult to resonate the circuit to the desired frequency, even for narrow band applications, because of the unavailability of tunable inductors or precise fixed inductors of small values required at high RF and microwave frequencies.

Figure 8:
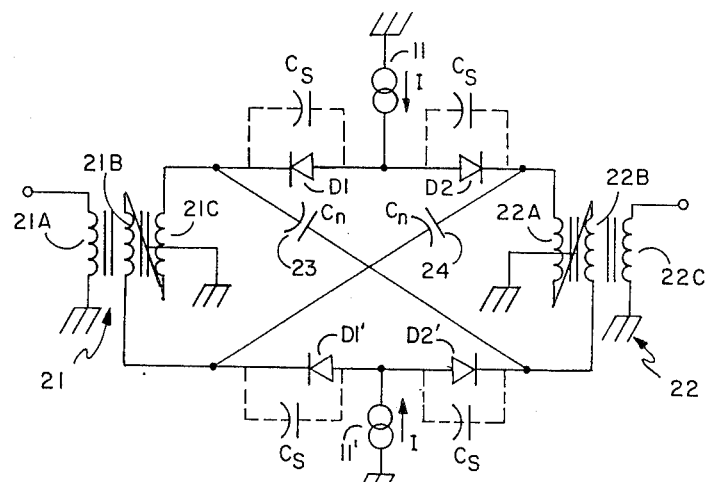
FIG. 8 is a schematic circuit diagram of a form of the invention using transformers and neutralizing capacitors.

Referring to FIG. 8, there is shown an embodiment of the invention providing broadband neutralization of diode capacitance. This embodiment incorporates the series pair of diodes of FIG. 1 embodied in balanced form having a second pair of diodes D1' and D2' fed by a second current source 11'. The circuit includes an input balancing transformer 21 and an output balancing transformer 22. Each transformer includes an input winding 21A, 22A, an intermediate winding 21B, 22B and an output winding 21C, 22C. A neutralizing capacitor 23 of value $C_n$ is connected between the cathodes of diodes D1 and D2'. A second neutralizing capacitor 23 also of value $C_n$ is connected between the cathodes of diodes D2 and D1'. FIG. 8 represents the effective capacitance across each diode as capacitors of value $C_s$. By making $C_n = C_s$, compensating currents are fed through output transformer 22 which cancel the undesired phase-shift introducing currents which flow through diode capacitances. Since the capacitances are all equal, the cancellation occurs at all frequencies, resulting in an inherently broadband operation. Since the current through the neutralizing capacitors 23 and 24 cancels that through the capacitances across the diodes, the level-dependent transmission phase shift is eliminated, resulting in the desired constant phase-limiting characteristic.

Figure 9:
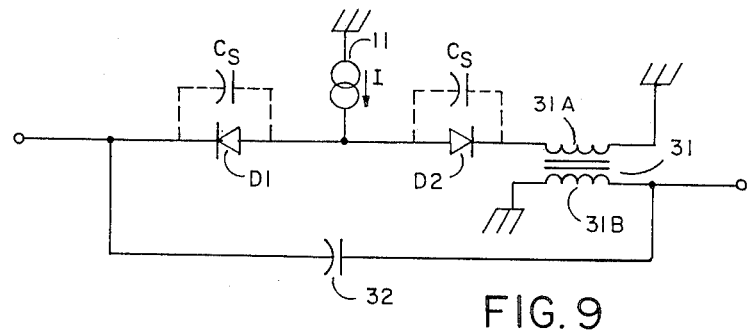
FIG. 9 is a schematic circuit diagram of a preferred form of the invention using only a single limiter and a single transformer.

Referring to FIG. 9, there is shown an unbalanced embodiment of the invention using only a single transformer, a single pair of series diodes and a single neutralizing capacitor. Output transformer 31 has a primary winding 31A and a secondary winding 31B. Neutralizing capacitor 32 is connected between the output terminal at the ungrounded end of secondary winding 31B and the cathode of diode D1. If $C_n = C_2$, a neutralizing current is transmitted through capacitor 32 to the output that cancels that through the nonconducting one of diodes D1 and D2 over a broad range of frequencies. Although this circuit is simpler than that of FIG. 8, the band over which constant phase limiting occurs is limited by the phase shift characteristics of transformer 31.

Figure 10:
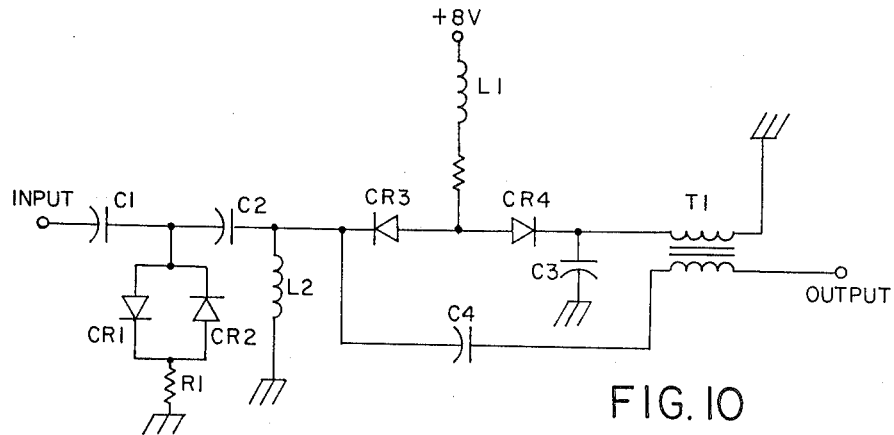
FIG. 10 is a schematic circuit diagram of an actual circuit generally in the form shown in FIG. 9.

Referring to FIG. 10, there is shown a schematic circuit diagram of an actual embodiment of the invention generally in the form of the circuit of FIG. 9 with specific parameter values set forth. Those skilled in the art will be able to build an actual embodiment of the invention using the specific parameter values set forth in the following table:

CR1–CR4: Hewlett Packard, 5082-0058, General Purpose Schottky Barrier Diodes
C1–C2: 0.01 µfd capacitors
C3: 2.2 pf capacitor
L1,L2: #38 AWG Nyleze Wire, 10 turns on ferrite core, Seimens, B62152-A0008-X060
R1: #37 AWG Nyleze wire, twisted pair, 3 turns on ferrite core, Seimens, B6 2152-A0008-X060
R1: 39Ω
C4: 100Ω twin lead, "tweeker", approx. 1" long Shunt diodes Cr1 and Cr2 in series with resistor R1 function to match the circuit at the input under high levels of drive. Capacitor C3 improves the impedance match at the output by compensating for the inductance of transformer T1.

This circuit was operated over the frequency range from 350 to 750 MHz. Capacitor C4 was adjusted to yield optimum phase performance over this frequency range. The small signal insertion loss was between 4 and 5 dB, depending on frequency. The limited output level was $-6 +/- 1$ dBm. The transmission phase was observed to be constant within $+/-2°$ over an input range from linear small signal up to +10 dBm.

There has been described novel apparatus and techniques for providing constant phase limiting over a wide range of input signal amplitudes and over a broad frequency range with structure that is relatively inexpensive, free from complexity and relatively easy to adjust. It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. In a diode limiting circuit having at least a first pair of first and second oppositely poled diodes connected together at a node and in series between an input and output with each of said diodes characterized by a shunt diode capacitance of value $C_s$ in parallel with the diode junction and biased by a constant current source connected to said node, the improvement for providing limiting with constant transmission phase substantially independent of input signal level at said input comprising, means for providing a current path from said input to said output for carrying current substantially equal in amplitude and opposite in phase to that which flows through said shunt diode capacitance to negate the undesirable phase shift caused by the current which flows through said shunt diode capacitance.

2. The improvement in accordance with claim 1 wherein said means for providing a current path comprises at least one neutralizing capacitor having a value $C_n$ substantially equal to said capacitance $C_s$.

3. In a diode limiting circuit having at least a first pair of first and second oppositely poled diodes connected together at a node and in series between an input and output with each of said diodes characterized by a shunt diode capacitance of value $C_s$ and biased by a current source connected to said node, the improvement for providing limiting substantially independent of input signal level at said input comprising, means for providing a current path in parallel with said shunt diode capacitances for canceling the effect of radio frequency currents through said shunt diode capacitances when the associated one of said first and second diodes is nonconducting, wherein said means for providing a current path comprises at least one neutralizing capacitor having a value $C_n$ substantially equal to said capacitance $C_s$, and an output transformer having a secondary winding connected to said output and a primary winding in series with said diodes, said secondary winding being in series with said neutralizing capacitor.

4. In a diode limiting circuit having at least a first pair of first and second oppositely poled diodes connected together at a node and in series between an input and output with each of said diodes characterized by a shunt diode capacitance of value $C_s$ and biased by a current source connected to said node, the improvement for providing limiting substantially independent of input signal level at said input comprising, means for providing a current path in parallel with said shunt diode capacitances for canceling the effect of radio frequency currents through said shunt diode capacitances when the associated one of said first and second diodes is nonconducting, wherein said means for providing a current path comprises at least one neutralizing capacitor having a value $C_n$ substantially equal to said capacitance $C_s$, input and output balanced transformers each having an input winding, an output winding and an intermediate winding, a second pair of said first and second oppositely poled diodes in series each characterized by a shunt diode capacitance of value $C_s$ and biased by a current source connected to said node, the intermediate and output windings of said input transformer being connected in series with all said diodes, the input and intermediate windings of said output transformer being connected in series with all said diodes, said one neutralizing capacitor of value $C_n$ connected between the output transformer input winding and the input transformer intermediate winding, and a second neutralizing capacitor of value $C_n$ connected between the output winding of the input transformer and the intermediate winding of the output transformer.

* * * * *